US011268300B2

(12) United States Patent
Langenberg et al.

(10) Patent No.: US 11,268,300 B2
(45) Date of Patent: Mar. 8, 2022

(54) ENERGY HARVESTING LOCK SYSTEM

(71) Applicant: Schlage Lock Company LLC, Carmel, IN (US)

(72) Inventors: Daniel Langenberg, Zionsville, IN (US); Joseph W. Baumgarte, Carmel, IN (US); Justin D. Seacat, Carmel, IN (US)

(73) Assignee: Schlage Lock Company LLC, Carmel, IN (US)

(*) Notice: Subject to any disclaimer, the term of this patent is extended or adjusted under 35 U.S.C. 154(b) by 470 days.

(21) Appl. No.: 16/250,284

(22) Filed: Jan. 17, 2019

(65) Prior Publication Data
US 2020/0232255 A1 Jul. 23, 2020

(51) Int. Cl.
E05B 47/06 (2006.01)
H02J 50/23 (2016.01)
H01H 9/02 (2006.01)
E05B 55/00 (2006.01)
G07C 9/00 (2020.01)
E05B 47/00 (2006.01)
H02M 7/04 (2006.01)
H03F 3/19 (2006.01)

(52) U.S. Cl.
CPC ........ E05B 47/0615 (2013.01); E05B 55/005 (2013.01); G07C 9/00563 (2013.01); H01H 9/02 (2013.01); H02J 50/23 (2016.02); E05B 2047/0057 (2013.01); H02M 7/04 (2013.01); H03F 3/19 (2013.01); H03F 2200/451 (2013.01)

(58) Field of Classification Search
CPC .................................................. E05B 47/06
See application file for complete search history.

(56) References Cited

U.S. PATENT DOCUMENTS

| 5,749,253 | A | * | 5/1998 | Glick | G07C 9/00571 |
| | | | | | 70/278.2 |
| 7,649,727 | B2 | * | 1/2010 | Elberbaum | H04L 12/2816 |
| | | | | | 361/170 |
| 8,729,737 | B2 | | 5/2014 | Schatz et al. | |
| 8,764,242 | B2 | | 7/2014 | Recker et al. | |
| 9,644,401 | B2 | * | 5/2017 | Nguyen | E05C 1/00 |
| 9,807,858 | B2 | | 10/2017 | Recker et al. | |
| 9,860,965 | B2 | | 1/2018 | Recker et al. | |
| 10,169,935 | B2 | * | 1/2019 | Paquin | G07C 9/20 |
| 10,455,663 | B2 | * | 10/2019 | Greene | H05B 47/11 |
| 10,819,137 | B2 | * | 10/2020 | Khoche | G06K 19/0723 |
| 2006/0094425 | A1 | | 5/2006 | Mickle et al. | |

FOREIGN PATENT DOCUMENTS

WO 2017127836 A1 7/2017

* cited by examiner

Primary Examiner — K. Wong
(74) Attorney, Agent, or Firm — Taft Stettinius & Hollister LLP

(57) ABSTRACT

An exemplary method includes transmitting a wireless power signal from an electrical device connected to line power, receiving the wireless power signal at an electronic access control device, and operating the electronic access control device using electrical power harvested from the wireless power signal. In certain forms, the method further includes adjusting an orientation of the antenna by which the wireless power signal is transmitted.

23 Claims, 6 Drawing Sheets

ENERGY HARVESTING LOCK SYSTEM

TECHNICAL FIELD

The present disclosure generally relates to electronic locksets, and more particularly but not exclusively relates to residential electronic locksets.

BACKGROUND

Certain existing electronic locksets are powered by a set of four alkaline batteries, which must be replaced periodically, typically every one to two years. The effective life of the batteries is significantly reduced in high-function locksets (e.g., those including cameras and/or always-on Wi-Fi), thereby exacerbating the battery replacement issue for such locksets. For these reasons among others, there remains a need for further improvements in this technological field.

SUMMARY

An exemplary method includes transmitting a wireless power signal from an electrical device connected to line power, receiving the wireless power signal at an electronic access control device, and operating the electronic access control device using electrical power harvested from the wireless power signal. In certain forms, the method further includes adjusting an orientation of the antenna by which the wireless power signal is transmitted. Further embodiments, forms, features, and aspects of the present application shall become apparent from the description and figures provided herewith.

DETAILED DESCRIPTION OF ILLUSTRATIVE EMBODIMENTS

Figure 1:
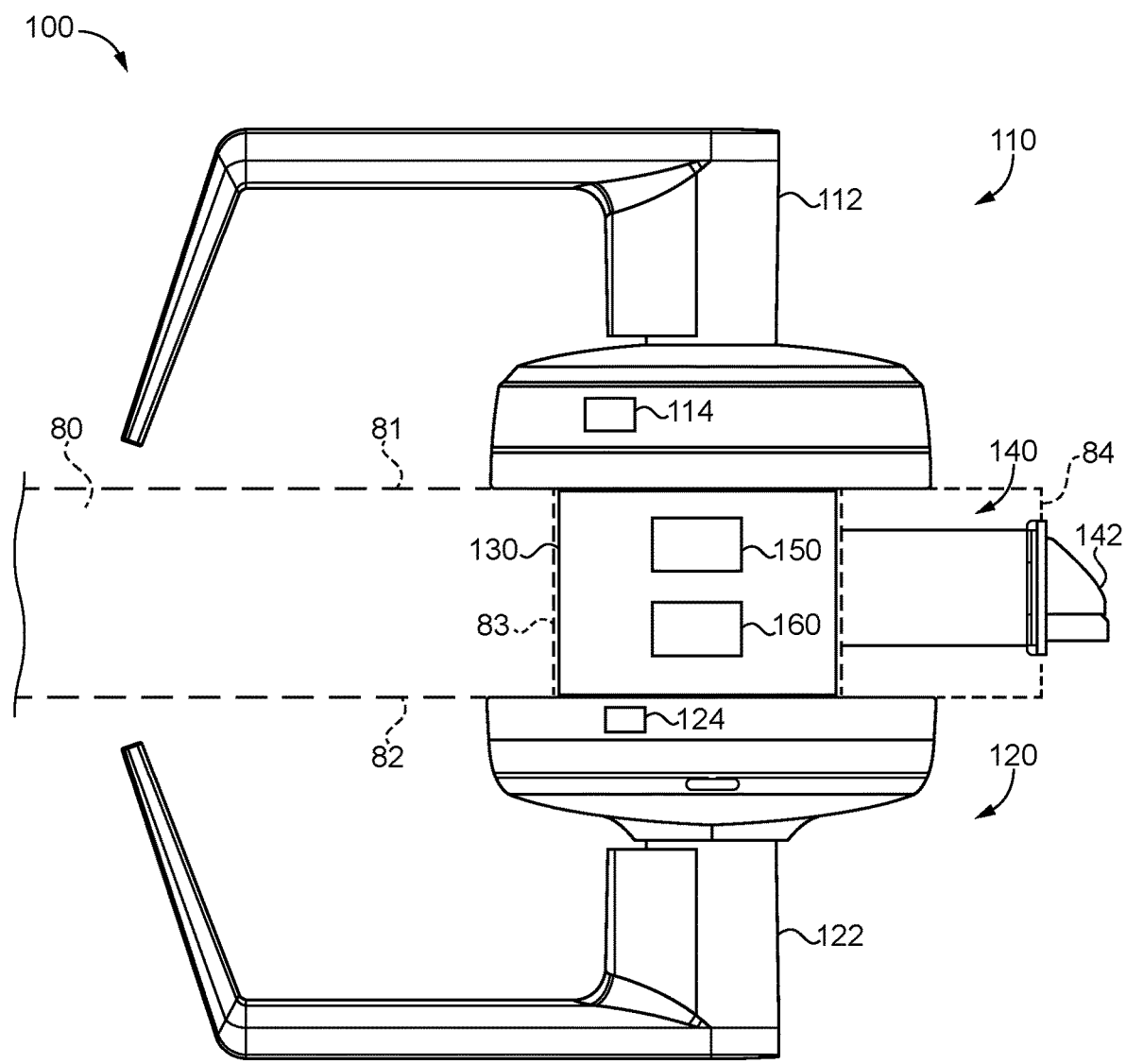
FIG. 1 is a plan view of a lockset according to certain embodiments.

Although the concepts of the present disclosure are susceptible to various modifications and alternative forms, specific embodiments have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. It should further be appreciated that although reference to a "preferred" component or feature may indicate the desirability of a particular component or feature with respect to an embodiment, the disclosure is not so limiting with respect to other embodiments, which may omit such a component or feature. Further, when a particular feature, structure, or characteristic is described in connection with an embodiment, it is submitted that it is within the knowledge of one skilled in the art to implement such feature, structure, or characteristic in connection with other embodiments whether or not explicitly described.

Additionally, it should be appreciated that items included in a list in the form of "at least one of A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C). Further, with respect to the claims, the use of words and phrases such as "a," "an," "at least one," and/or "at least one portion" should not be interpreted so as to be limiting to only one such element unless specifically stated to the contrary, and the use of phrases such as "at least a portion" and/or "a portion" should be interpreted as encompassing both embodiments including only a portion of such element and embodiments including the entirety of such element unless specifically stated to the contrary.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures unless indicated to the contrary. Additionally, the inclusion of a structural or method feature in a particular figure is not meant to imply that such feature is required in all embodiments and, in some embodiments, may not be included or may be combined with other features.

The disclosed embodiments may, in some cases, be implemented in hardware, firmware, software, or a combination thereof. The disclosed embodiments may also be implemented as instructions carried by or stored on one or more transitory or non-transitory machine-readable (e.g., computer-readable) storage media, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

With reference to FIG. 1, illustrated therein is an access control device in the form of a lockset 100 according to certain embodiments. The lockset 100 is mounted to a door 80, and generally includes an inside assembly 110 mounted to an inner side 81 of the door 80, an outside assembly 120 mounted to an outer side 82 of the door 80, a chassis 130 mounted within a cutout 83 of the door 80 and connected with the inside assembly 110 and the outside assembly 120, and a bolt mechanism 140 operably connected with the chassis 130 and operable to extend beyond a swinging edge 84 of the door 80. The lockset 100 further includes an electronically-operable locking mechanism 150 having a locking state and an unlocking state, and a control assembly 160 operable to transition the locking mechanism 150 between the locking state and the unlocking state.

The inside assembly 110 includes an inside actuator 112 that is operably connected to the chassis 130 such that the inside actuator 112 is at least selectively operable to actuate the bolt mechanism 140. In the illustrated form, the inside actuator 112 is provided in the form of a handle, and more particularly as a lever. In other embodiments, the inside actuator 112 may be provided in another form, such as that of a knob, a thumbturn, or a pushbar mechanism. The inside assembly 110 further includes a lock state selector 114 operable to transition the lockset 100 between a locked state and an unlocked state. In certain forms, the lock state selector 114 may be a mechanical lock state selector that physically drives the locking mechanism 150 between its locking state and its unlocking state. In other forms, the lock state selector 114 may be an electronic lock state selector that is in communication with the control assembly 160 and is operable to cause the control assembly 160 to transition the locking mechanism 150 between its locking state and its unlocking state.

The outside assembly 120 includes an outside actuator 122 that is operably connected to the chassis 130 such that the outside actuator 122 is selectively operable to actuate the bolt mechanism 140. In the illustrated form, the outside actuator 122 is provided in the form of a handle, and more particularly as a lever. In other embodiments, the outside actuator 122 may be provided in another form, such as that of a knob, a thumbturn, or a lock cylinder. The outside assembly 120 may further include a credential reader 124 in communication with the control assembly 160. The credential reader 124 may, for example, take the form of a card reader, a keypad, or a biometric credential reader. During operation of the lockset 100, presentation of an appropriate credential to the credential reader 124 (e.g., by inputting a code or presenting a card, a fob, or a biometric input) causes the control assembly 160 to transition the locking mechanism 150 from the locked state to the unlocked state. In certain forms, the credential reader 124 may be considered a lock state selector.

The chassis 130 is mounted within the door cutout 83 and at least selectively connects each of the actuators 112, 122 with the bolt mechanism 140. The chassis 130 may, for example, take the form of a mortise-format chassis, a cylindrical-format chassis, or a tubular-format chassis, the features of which will be readily apparent to those skilled in the art. The chassis 130 has a locked state and an unlocked state. In the unlocked state, the chassis 130 maintains the bolt mechanism 140 in a retracted state and/or permits the outside assembly 120 to retract the bolt mechanism 140. In the locked state, the chassis 130 maintains the bolt mechanism 140 in an extended state and/or prevents the outside assembly 120 from retracting the bolt mechanism 140. The chassis 130 may be transitioned between the locked state and the unlocked state by the electronic locking mechanism 150.

The bolt mechanism 140 includes a bolt 142 having an extended position and a retracted position. With the bolt 142 in the extended position and the door 80 in the closed position, the bolt 142 extends into the doorframe and retains the door 80 in the closed position. When the bolt 142 is retracted, the door 80 is free to move from the closed position to the open position. In the illustrated form, the bolt mechanism 140 is provided in the form of a latchbolt mechanism, and includes a spring-loaded latchbolt 142 that is biased toward its extended position. In other forms, the bolt mechanism 140 may be provided in the form of a deadbolt mechanism, and may include a bolt 142 in the form of a deadlocking deadbolt. Additionally, while the illustrated bolt mechanism 140 is provided adjacent the chassis 130, it is also contemplated that the bolt mechanism 140 may be positioned remotely from the chassis 130.

The electronic locking mechanism 150 may be mounted within the chassis 130, and has an unlocking state in which the door 80 can be opened from the outer side 82 (e.g., by operating the outside actuator 122 and/or pulling the door 80 toward its open position), and a locking state in which the door 80 cannot be opened from the outer side 82. In the illustrated form, the locking mechanism 150 prevents the outside actuator 122 from actuating the bolt mechanism 140 when in the locking state, and permits the outside actuator 122 to actuate the bolt mechanism 140 when in the unlocking state. In other forms, the locking mechanism 150 may retract the bolt 142 when transitioned from the locking state to the unlocking state, and may extend the bolt 142 when transitioned from the unlocking state to the unlocking state.

Figure 2:
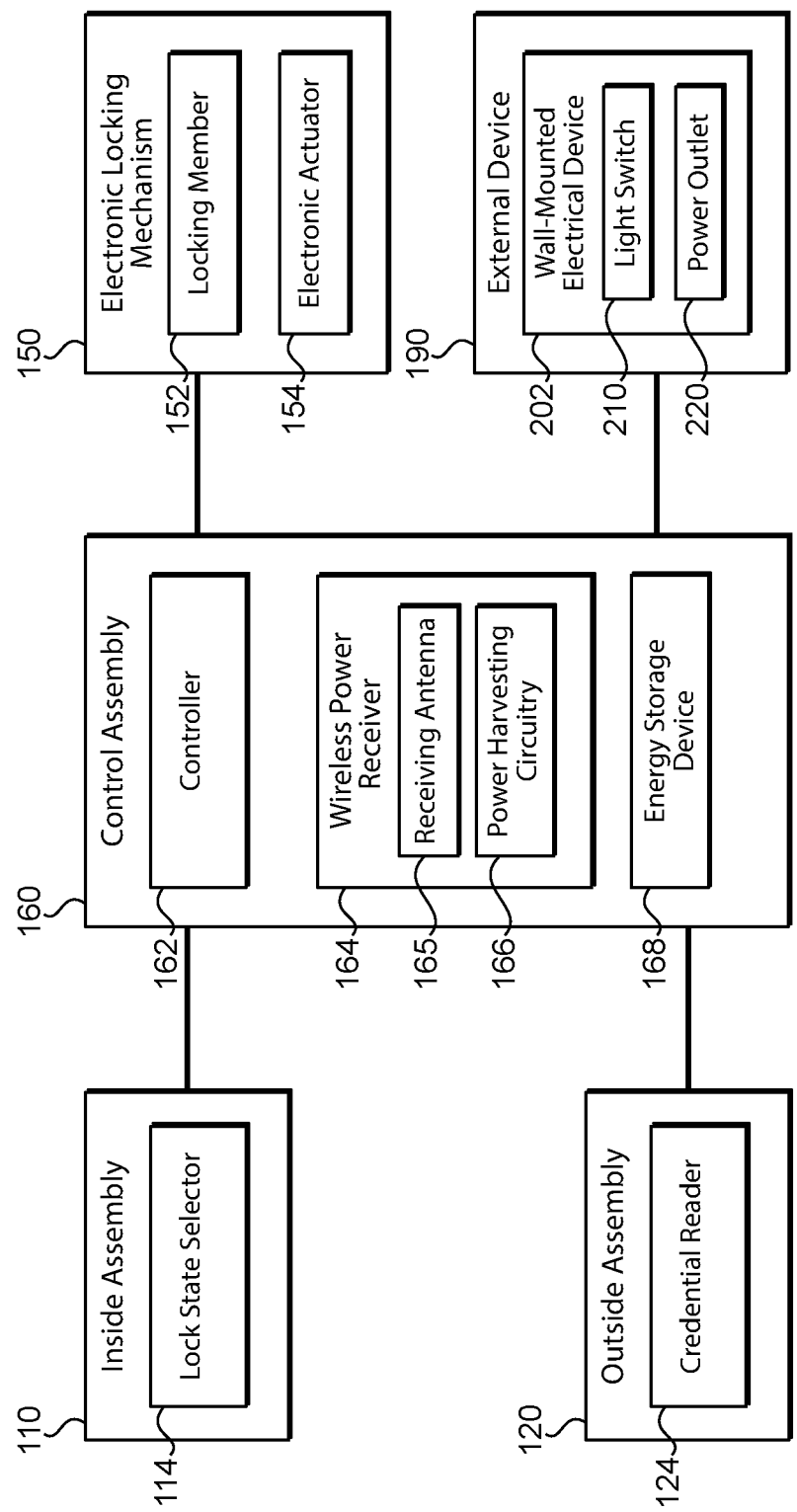
FIG. 2 is a schematic block diagram of a control assembly according to certain embodiments.

With additional reference to FIG. 2, the electronic locking mechanism 150 includes a locking member 152 having a locking position and an unlocking position, and an electronic actuator 154 operable to drive the locking member 152 between the locking position and the unlocking position to thereby adjust the locked/unlocked state of the lockset 100. In certain forms, the locking member 152 may be configured to selectively prevent the outside actuator 122 from retracting the bolt 142. As one example, the outside actuator 122 may be operably coupled with the bolt mechanism 140 such that rotation of the actuator 122 retracts the bolt 142, and the locking member 152 may prevent rotation of the actuator 122 when in the locking position. As another example, the outside actuator 122 may be selectively coupled with the bolt mechanism 140 via the locking member 152. In such forms, rotation of the actuator 122 may cause retraction of the bolt 142 when the locking member 152 is in its unlocking position, and the actuator 122 may freewheel without causing retraction of the bolt 142 when the locking member 152 is in its locking position. In further embodiments, the locking member 152 may be provided as the bolt 142 such that the locking mechanism 150 drives the bolt 142 between its extended locking position and its retracted unlocking position without requiring operation of either manual actuator 112, 122.

The control assembly 160 includes a controller 162 and a wireless power receiver 164 operable to receive wireless power from one or more external devices 190, and may further include an energy storage device 168. As described herein, the external device 190 may be provided in the form of a light switch, an electrical outlet, or another electrical device. The controller 162 is in communication with the credential reader 124 and the locking device 150, and is configured to control operation of the locking device 150 based in part upon information received from the credential reader 124. For example, when an appropriate credential is presented to the credential reader 124, the controller 162 may transmit an unlock signal that transitions the locking device 150 from the locking state to the unlocking state to thereby permit opening of the door 80 from the outer side 82 thereof. As described herein, the wireless power receiver 164 includes a receiving antenna 165 and power harvesting circuitry 166 structured to harvest electrical power from wireless power signals received at the antenna 165.

In certain forms, the wireless power receiver 164 and the energy storage device 168 may be provided in the lockset 100 at the time of manufacture. It is also contemplated that the wireless power receiver 164 and the energy storage device 168 may be provided as a retrofit power pack configured to replace an existing power pack of a battery-powered version of the lockset 100. An example of such a retrofit power pack and a lockset configured for use with the same are described below with reference to FIG. 5.

The external device 190 is configured for connection to line power, and includes a wireless power transmitter configured to transmit a wireless power signal using the line power. In certain forms, the wireless power transmitter is configured to transmit the wireless power signal over a radio frequency (RF) band. In certain forms, the wireless power transmitter is configured to transmit the wireless power signal over an unregulated RF band, such as 315 MHz, 433 MHz, 915 MHz, 2.4 GHz, or 5 GHz. As will be appreciated, the wireless power transmitter includes an antenna operable to transmit the wireless power signal over the selected band, and the wireless power receiver 164 includes a corresponding antenna 165 configured to receive the wireless power signal over the selected band. In certain forms, the external device 190 may be provided as a wall-mounted electrical device 202 that is mounted to a wall near the door 80 and is connected to line power. As described herein, the wall-mounted electrical device 202 may, for example, be provided in the form of a light switch 210 or an electrical outlet 220.

As should be appreciated, the lockset 100 may include additional or alternative elements and features not specifically illustrated in FIGS. 1 and 2. As one example, the lockset 100 may include a wireless transceiver (e.g., a Bluetooth transceiver and/or a Wi-Fi transceiver) configured to facilitate communication between the controller 162 and an external device such as an access control system, a gateway, or a mobile device. Thus, while the lockset 100 may be provided as a standalone lockset, it is also contemplated that the lockset 100 may be provided as a networked lockset within an access control system. As another example, the lockset 100 may include a camera configured to photograph and/or video persons approaching the door 80. In certain forms, the lockset 100 may be configured to transmit such photographs and/or videos via the wireless transceiver.

Figure 3:
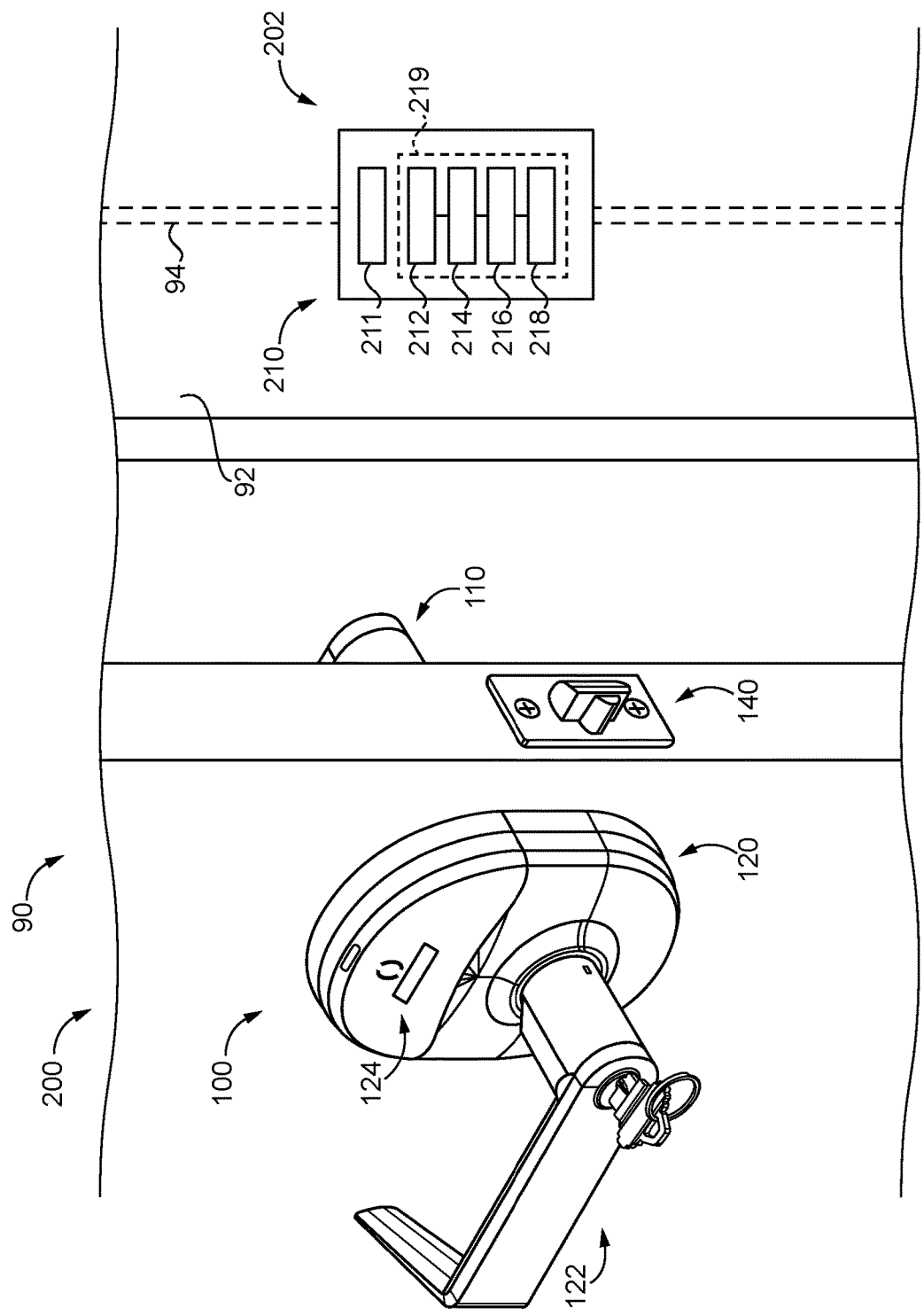
FIG. 3 is a perspective illustration of a system according to certain embodiments.

With additional reference to FIG. 3, illustrated therein is a system 200 according to certain embodiments. The system 200 is installed to a closure assembly 90 including the door 80 and a wall 92 having a power line 94 therein. The system 200 includes the lockset 100, and further includes an external device in the form of a wall-mounted electrical device 202. In the illustrated form, the wall-mounted electrical device 202 is provided in the form of a light switch 210. The light switch 210 is connected to the power line 94 such that the light switch 210 is operable to open and close a circuit including the power line 94 to thereby activate and deactivate an electrical device on the circuit, such as a light or a power outlet. The light switch 210 may, for example, be located within three feet of the lockset 100 when the door 80 is in its closed position.

While the wall-mounted electrical device 202 is illustrated and described herein with reference to the light switch 210, it is also contemplated that the wall-mounted electrical device 202 may be provided in another form, such as that of a power outlet 220 (FIG. 2). In such forms, the power outlet may include a wireless power transmitter having the features described herein with reference to the wireless power transmitter 219 of the light switch 210.

The light switch 210 generally includes a movable member 211 such as a toggle or a slider connected to the power line 94 and operable to transition the light switch 210 between a first state and a second state, such as an on state and an off state. As will be appreciated, the light switch 211 may be a multipole light switch such that the light switch 210 conducts power through a first conductive path when in the first state and conducts power through a second conductive path when in the second state. The illustrated light switch 210 further includes a wireless power transmitter 219. In the illustrated form, the wireless power transmitter 219 includes an AC-to-DC converter 212 connected to the power line 94, an RF generator 214 in communication with the converter 212, an amplifier 216 connected to the generator 214, and an antenna 218 connected to the amplifier 216.

The AC-to-DC converter 212 is configured to convert AC power received from the power line 94 to a DC voltage usable by the RF generator 214. For example, the converter 212 may convert 120 Vac current from the power line 94 to 5 Vdc power for use by the RF generator 214. As will be appreciated, the converter 212 may include one or more rectifiers and/or other circuitry required to convert the power from the form provided by the power line 94 to the form usable by the generator 214.

The RF generator 214 is configured to generate an RF signal that serves as an initial wireless signal using power received from the converter 212. By way of example, the generator 214 may generate the initial wireless power signal at a frequency of 915 MHz. It is to be appreciated that the initial wireless signal may be generated within a different RF band, such as the 315 MHz band, the 433 MHz band, the 2.4 GHz band, or the 5 GHz band.

The amplifier 216 is configured to amplify the initial wireless signal to a selected power, thereby providing an amplified wireless power signal. For example, the amplifier 216 may amplify the initial wireless signal to a power of 1 W. While one example of the selected power is provided, it is to be appreciated that the amplified wireless power signal may be provided at a different power.

The antenna 218 is configured to transmit the amplified power signal at the selected frequency. For example, the antenna 218 may be configured to transmit the wireless power signal at a frequency of 915 MHz. Other frequencies are also contemplated as being used, such as frequencies in the 315 MHz band, the 433 MHz band, the 2.4 GHz band, or the 5 GHz band.

Figure 4:
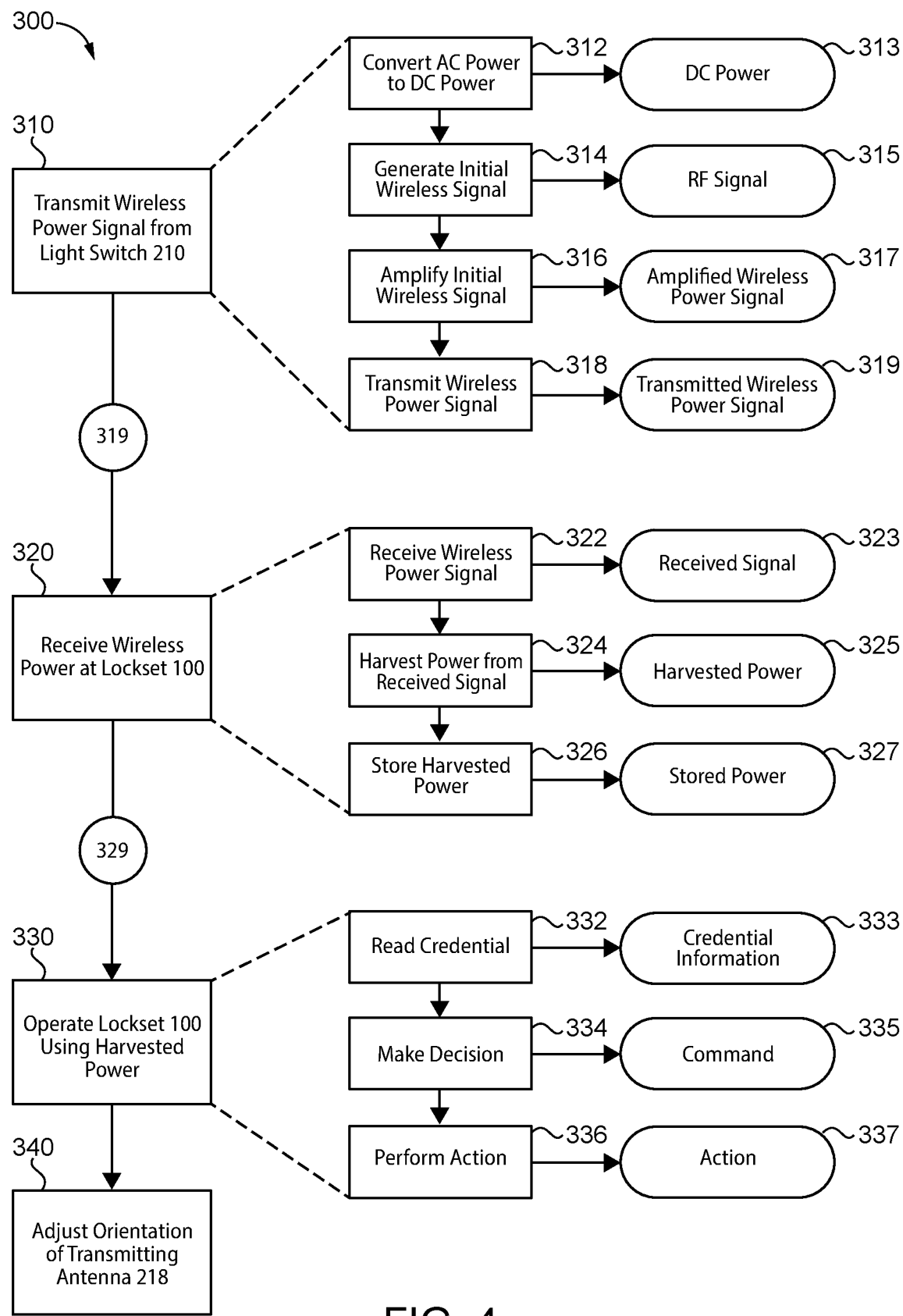
FIG. 4 is a schematic block diagram of a process according to certain embodiments.

With additional reference to FIG. 4, illustrated therein is an exemplary process 300 that may be performed using the system 200. Operations or blocks illustrated for the processes in the present application are understood to be examples only, and operations or blocks may be combined or divided, and added or removed, as well as re-ordered in whole or in part, unless explicitly stated to the contrary. The process 300 generally includes blocks 310, 320 and 330. As described herein, block 310 generally involves transmitting a wireless power signal from the light switch 210, block 320 generally involves receiving the wireless power signal at the lockset 100, and block 330 generally involves operating the lockset 100 using power harvested from the wireless power signal. In certain forms, the process 300 further includes block 340, which generally involves adjusting an orientation of the transmitting antenna 218.

Block 310 generally involves transmitting a wireless power signal 319 from the light switch 310 using the wireless power transmitter 219, and in the illustrated form includes a converting block 312, a generating block 314, an amplifying block 316, and a transmitting block 318. As described herein, the converting block 312 involves converting AC power to DC power 313, the generating block 314 involves generating an RF signal 315 that serves as an initial wireless signal, the amplifying block 316 involves generating an amplified wireless power signal 317, and the transmitting block 318 involves generating a transmitted wireless power signal 319.

Block 312 generally involves converting, by the AC-to-DC converter 212, AC power received from the power line 94 to a DC voltage usable by the generator 214, thereby providing a DC power 313. For example, block 312 may involve the converter 212 converting 120 Vac current from the power line 94 to 5 Vdc power 313 for use by the RF generator 214.

Block 314 generally involves generating, by the RF generator 214, an RF signal 315 or initial wireless signal using the DC power 313 received from the converter 212. By way of example, block 314 may involve the generator 214 generating the initial wireless signal 315 at a frequency of 915 MHz. It is to be appreciated that the initial wireless signal 315 may be generated within a different RF band, such as the 315 MHz band, the 433 MHz band, the 2.4 GHz band, the 5 GHz band, or another unregulated RF band.

Block 316 generally involves amplifying, by the amplifier 216, the initial wireless signal 315 to a selected power, thereby providing an amplified wireless power signal 317. For example, the amplifier 216 may amplify the initial wireless signal 315 to a power of 1 W, thereby providing the amplified wireless power signal 317. While one example of the selected power is provided, it is to be appreciated that the amplified wireless power signal 317 may be provided at a different power, such as within a range of 0.5 W to 2 W.

Block 318 generally involves transmitting, by the transmitting antenna 218, the amplified wireless power signal 317, thereby providing a transmitted wireless power signal 319. As will be appreciated, the transmitting antenna 218 may transmit the wireless power signal 319 at the selected frequency, such as a frequency of 915 MHz. As noted above, other frequencies are also contemplated, such as the 315 MHz band, the 433 MHz band, the 2.4 GHz band, the 5 GHz band, or other unregulated RF bands.

Block 320 generally involves receiving the wireless power at the lockset 100, thereby providing a harvested power 329. In the illustrated form, block 320 includes a receiving block 322 and a harvesting block 324, and may further include a storing block 326. As described herein, the receiving block 322 generally involves providing a received wireless power signal 323, the harvesting block 324 generally involves generating a harvested power 325, and the storing block 326 generally involves providing a stored power 327.

Block 322 generally involves receiving the transmitted wireless power signal 319 at the antenna 165, thereby providing a received signal 323. As noted above, the receiving antenna 165 is configured to receive wireless signals at the same frequency at which the transmitting antenna 218 is configured to transmit. For example, in embodiments in which the transmitting antenna 218 is configured to transmit the wireless power signal 319 at a frequency 915 MHz, the receiving antenna 165 may likewise be configured to receive wireless signals at a frequency of 915 MHz. As will be appreciated, the receiving antenna 165 may be structured to receive wireless signals at additional or alternative frequencies, such as in embodiments in which the transmitting antenna 218 transmits at such additional or alternative frequencies.

Block 324 generally involves operating the energy harvesting circuitry 166 to harvest electrical power from the received signal 323, thereby providing harvested power 325. As will be appreciated by those skilled in the art, the harvesting circuitry 166 may include a band-pass filter, a rectifier, a low-pass filter, and/or any additional or alternative circuitry required to generate harvested power 325 from the received signal 323 and/or to condition the power to a form usable by the controller 162 and/or the energy storage device 168.

Block 326 generally involves storing the harvested power 325 at the energy storage device 168, thereby providing stored power 327. In certain forms, the energy storage device 168 may comprise a rechargeable battery (e.g., a lithium battery), and block 326 may involve charging the rechargeable battery. In certain forms, the energy storage device 168 may comprise a super-capacitor, and block 326 may involve charging the super-capacitor. In further embodiments, block 326 may be omitted, and the harvested power 323 may be directed to the controller 162 without being stored in an energy storage device.

The process 300 further includes providing the energy 329 harvested in block 320 to the electronic components of the lockset 100 to facilitate performance of block 330. In certain embodiments and/or circumstances, the harvested energy 329 may be energy that has been stored in the energy storage device 326 as stored energy 327. In other embodiments and/or circumstances, the harvested energy 329 may be harvested power 325 that has not been stored in an energy storage device such as the energy storage device 168.

Block 330 generally involves operating the electronic lockset 100 using the harvested energy 329, and in the illustrated form includes a credential reading block 332, a decision-making block 334, and a performing block 336. As described herein, the credential reading block 332 generally involves generating credential information 333, the decision-making block 334 generally involves generating a command 335, and the performing block 336 generally involves performing an action 337 corresponding to the command 335.

Block 332 generally involves reading a credential by the credential reader 124, thereby generating credential information 333. As noted above, the credential reader 124 may take any of a number of forms, such as that of a card reader, a fob reader, a keypad, or a biometric credential reader. Thus, block 332 may involve operating the credential reader 124 to generate the credential information 333 based on information received from a scanned card, a fob, a scanned biometric credential, or a keypad that has been operated to input a code. While certain exemplary forms have been described with respect to the credential reader 124, it is to be appreciated that the credential reader 124 may take another form not specifically described herein.

Block 334 generally involves operating the controller 162 to compare the credential information 333 to authorized credential information, to determine an action to perform based upon the comparing, and to transmit a command 335 related to the determined action. As one example, block 334 may involve comparing the credential information 333 to authorized credential information and transmitting the command 335 as a grant/deny command based upon the comparing. More particularly, the grant/deny command may be a grant command when the credential information 333 corresponds to an authorized credential, and the grant/deny command may be a deny command when the credential information 333 does not correspond to an authorized credential.

Block 336 generally involves performing an action 337 corresponding to the command 335 transmitted by the controller 162. For example, in embodiments and/or circumstances in which the issued command 335 is a grant command, block 336 may involve performing the action 337 using the electronic locking mechanism 150, and the action 337 may involve causing the actuator 154 to move the locking member 152 to the unlocked position. As another example, in embodiments and/or circumstances in which the issued command 335 is a deny command, block 336 may involve performing the action 337 using a visual and/or audible indicator. Such an action 337 may involve issuing a visual and/or audible indication that the presented credential is not authorized to unlock the lockset 100.

While block 330 has generally been described as involving reading a credential and performing a grant/deny action based on whether or not the credential is authorized, it is to be appreciated that additional and alternative embodiments are contemplated for block 330. For example, operating the lockset 100 at block 330 may involve receiving at the controller 162 a signal indicating that the locked state selector 114 has been operated to transition the lockset 100 from an unlocked state to a locked state. In such forms, block 334 may involve transmitting a lock command 335 from the controller 162 to the locking mechanism 150, and block 336 may involve causing the locking mechanism 150 to move the locking member 152 from its unlocking position to its locking position in response to receiving the unlock command 335.

Additionally, while certain above-described examples for block 330 involve locking and/or unlocking the lockset 100, it is to be appreciated that block 330 may involve performing actions that do not directly pertain to the locked/unlocked state of the lockset 100. For example, block 330 may involve operating a camera of the lockset 100 to record approaching persons, and/or operating a wireless transceiver of the lockset 100 to wirelessly communicate with an external device 190, such as a gateway, a central access control system, or a mobile device. Furthermore, while the process 300 has been described with reference to the illustrated lockset 100, it is to be appreciated that the process 300 may be utilized in connection with other forms of access control devices, such as exit devices.

The process 300 may further include block 340, which generally involves adjusting the orientation of the transmitting antenna 218. As will be appreciated, the strength of the received signal 323 may depend upon the orientation of the transmitting antenna 218, particularly in embodiments in which the transmitting antenna 218 is provided as a directional antenna. Thus, the strength of the received signal 323 can be adjusted by altering the orientation of the transmitting antenna 218. Block 340 may involve monitoring the strength of the received signal 323 while adjusting the orientation of the antenna 218 in order to ensure that the orientation of the antenna 218 provides satisfactory or optimal transmission of power to the receiving antenna 166. An example of a wall-mounted electrical device operable to adjust the orientation of the transmitting antenna 218 is described below with reference to FIG. 6.

Figure 5:
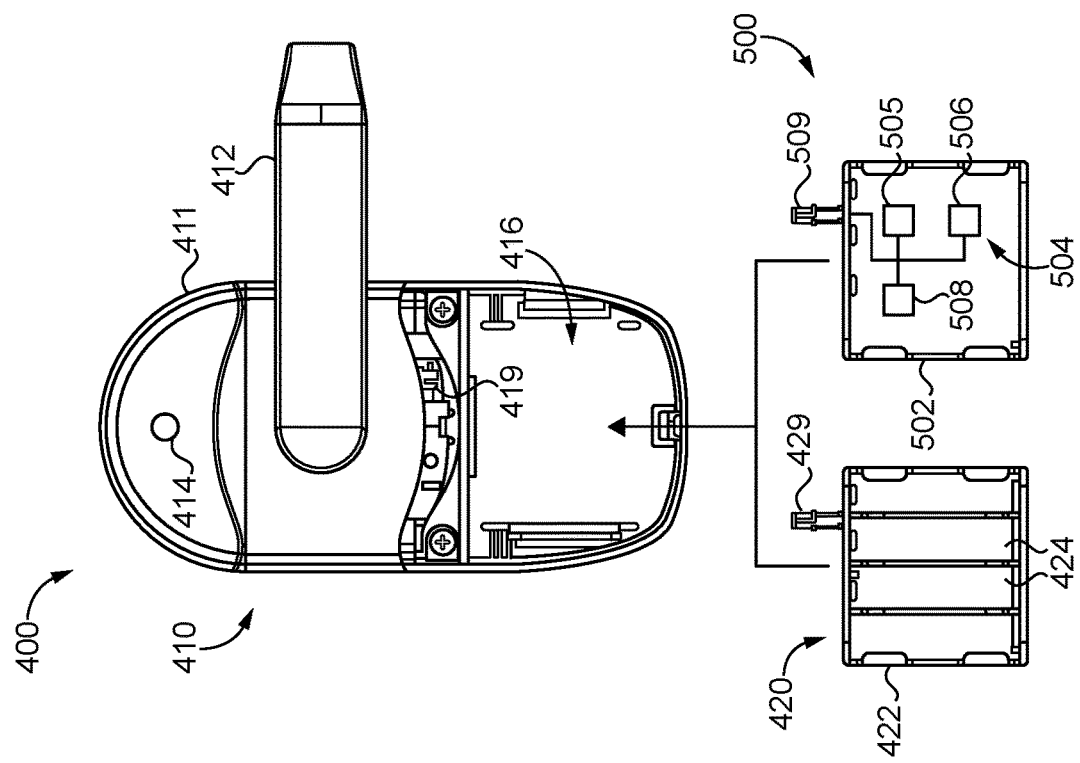
FIG. 5 is a plan view of a lockset including a retrofit power pack according to certain embodiments.

With additional reference to FIG. 5, illustrated therein is an electronic lockset 400 according to certain embodiments, which is an example of the above-described electronic lockset 100. More particularly, illustrated in FIG. 5 is an inside assembly 410 of the lockset 400. The inside assembly 410 includes an escutcheon 411, a handle 412 rotatably mounted to the escutcheon 411, and a lock status selector 414 in the form of a button. The escutcheon 411 houses various electronic components of the lockset 400, and defines a receiving space 416 operable to receive a power pack 420. An electrical port 419 is formed in the vicinity of the receiving space 416, and is connected to the electronic components of the lockset 400, including a controller.

The power pack 420 is sized and shaped to be seated in the receiving space 416, and includes a housing 422, a plurality of batteries 424 seated in the housing 422, and an electrical connector 429 connected with terminals of the batteries 424 and configured to matingly engage the port 419. As will be appreciated, when the connector 429 is so engaged with the port 419, the electronic lockset 400 is operable to draw electrical power from the power pack 420.

Also illustrated in FIG. 5 is a retrofit power pack 500 according to certain embodiments. The retrofit power pack 500 is configured to replace the existing power pack 420, and includes a housing 502 and an electrical connector 509 corresponding to the housing 422 and connector 429. The retrofit power pack 500 further includes a wireless power receiver 504 operable to serve as the above-described wireless power receiver 164. Thus, the wireless power receiver 504 includes a receiving antenna 505 and power harvesting circuitry 506 corresponding to the above-described antenna 165 and circuitry 166. The retrofit power pack 500 may further include an energy storage device 508, such as a super-capacitor or a rechargeable battery.

The retrofit power pack 500 is configured to replace the existing power pack 420 to convert the lockset 400 from a conventional-type lockset to a lockset 100 operable for use in the system 200. Thus, when the retrofit power pack 500 is installed to the lockset 400 in place of the existing power pack 420, the lockset 400 is capable of functioning in the manner described above with reference to the lockset 100, the system 200, and the process 300. In certain forms, the electronic components of the lockset 400 may be configured to for operation with power of a particular voltage from the power pack 420, such as six-volt power. Those skilled in the art will readily appreciate that the retrofit power pack 500 may be configured to convert the harvested power to the voltage requirements of the existing electronic circuitry to ensure compatibility between the lockset 400 and the retrofit power pack 500.

Figure 6:
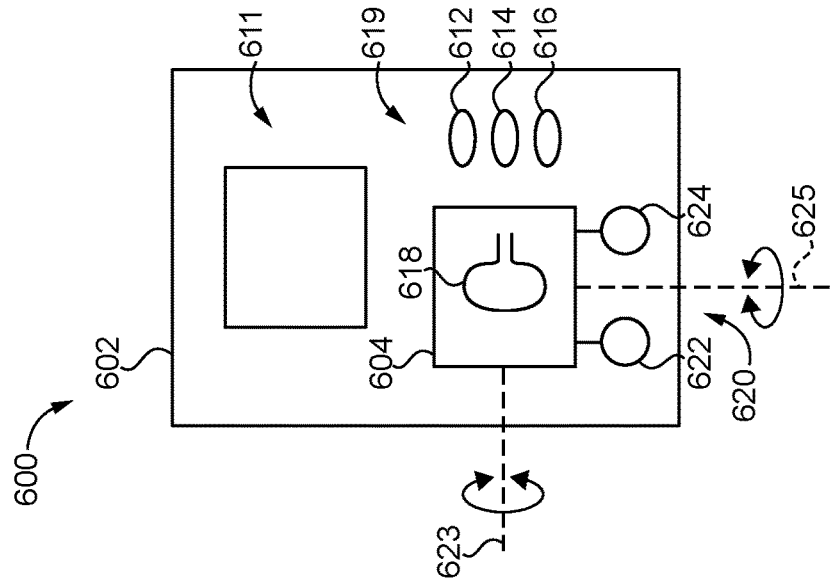
FIG. 6 is a schematic representation of an electrical device according to certain embodiments.

With additional reference to FIG. 6, illustrated therein is a schematic representation of a wall-mounted device 600 according to certain embodiments. The wall-mounted device 600 may, for example, be utilized as the wall-mounted device 202 in the system 200. The device 600 is configured for mounting in a standard electrical box of the type in which light switches and electrical sockets are typically mounted. The device 600 generally includes a housing 602, a platform 604 movably mounted to the housing 602, and a wireless power transmitter 619 of the type described above with reference to the wireless power transmitter 219. The wireless power transmitter 619 generally includes an AC-to-DC power converter 612, an RF generator 614, an amplifier 616, and a transmitting antenna 618, which respectively correspond to the above-described converter 212, generator 214, amplifier 216, and antenna 218. In certain forms, the transmitting antenna 618 may be provided as a directional antenna.

The device 600 may further include an electrical operating component 611. In certain forms, the device 600 may be provided as a light switch in which the electrical operating component 611 is provided as a toggle or slider. In other embodiments, the device 600 may be provided as a power outlet in which the electrical operating component 611 is provided in the form of a socket. In further forms, the electrical operating component 611 may be omitted, and the device 600 may serve as a standalone wireless power transmitter.

The device 600 further includes an adjustment mechanism 620 operable to adjust an orientation of the antenna 618.

More particularly, the antenna 618 is mounted to the platform 604, and the adjustment mechanism 620 is operable to adjust the orientation of the platform 604. The adjustment mechanism 620 includes a first adjuster 622 operable to adjust the orientation of the platform 604 and antenna 618 about a first axis 623, and may further include a second adjuster 624 operable to adjust the orientation of the platform 604 and antenna 618 about a second axis 625 perpendicular to the first axis 623. In the illustrated form, each of the adjusters 622, 624 is provided in the form of a knob that, when rotated, causes rotation of the platform 604 about the corresponding axis 623, 625. It is also contemplated that one or both of the adjusters 622, 624 may take another form, such as that of a slider. Regardless of the precise form of the adjuster(s), the adjustment mechanism 620 is operable to adjust the orientation of the antenna 618 about at least one axis, thereby facilitating performance of block 340 in the manner described above.

Figure 7:
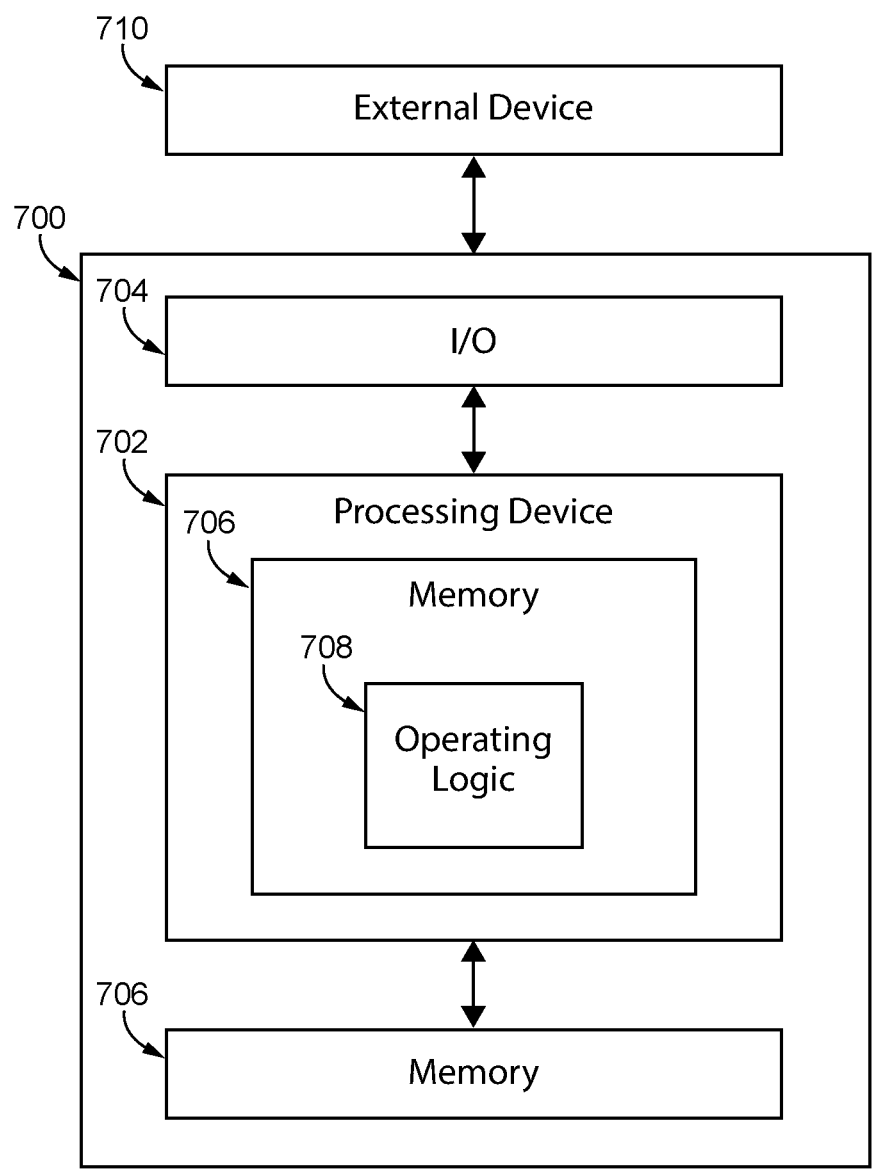
FIG. 7 is a schematic block diagram of a computing device.

Referring now to FIG. 7, a simplified block diagram of at least one embodiment of a computing device 700 is shown. The illustrative computing device 700 depicts at least one embodiment of a lockset, lock status selector, credential reader, controller, locking mechanism, or external device that may be utilized in connection with the lockset 100, lock status selector 114, credential reader 124, controller 162, locking mechanism 150, or external device 190 shown in FIGS. 1 and 2.

Depending on the particular embodiment, computing device 700 may be embodied as a server, desktop computer, laptop computer, tablet computer, notebook, netbook, Ultrabook™ mobile computing device, cellular phone, smartphone, wearable computing device, personal digital assistant, Internet of Things (IoT) device, reader device, access control device, control panel, processing system, router, gateway, and/or any other computing, processing, and/or communication device capable of performing the functions described herein.

The computing device 700 includes a processing device 702 that executes algorithms and/or processes data in accordance with operating logic 708, an input/output device 704 that enables communication between the computing device 700 and one or more external devices 710, and memory 706 which stores, for example, data received from the external device 710 via the input/output device 704.

The input/output device 704 allows the computing device 700 to communicate with the external device 710. For example, the input/output device 704 may include a transceiver, a network adapter, a network card, an interface, one or more communication ports (e.g., a USB port, serial port, parallel port, an analog port, a digital port, VGA, DVI, HDMI, FireWire, CAT 5, or any other type of communication port or interface), and/or other communication circuitry. Communication circuitry may be configured to use any one or more communication technologies (e.g., wireless or wired communications) and associated protocols (e.g., Ethernet, Bluetooth®, Bluetooth Low Energy (BLE), Wi-Fi®, WiMAX, etc.) to effect such communication depending on the particular computing device 700. The input/output device 704 may include hardware, software, and/or firmware suitable for performing the techniques described herein.

The external device 710 may be any type of device that allows data to be inputted or outputted from the computing device 700. For example, in various embodiments, the external device 710 may be embodied as the access control device 100, the inside assembly 110, the outside assembly 120, the bolt mechanism 140, the locking device 150, the control assembly 160, the external device 190, the light switch 210, the power outlet 220, the lockset 400, and/or the wall-mounted device 600. Further, in some embodiments, the external device 710 may be embodied as another computing device, switch, diagnostic tool, controller, printer, display, alarm, peripheral device (e.g., keyboard, mouse, touch screen display, etc.), and/or any other computing, processing, and/or communication device capable of performing the functions described herein. Furthermore, in some embodiments, it should be appreciated that the external device 710 may be integrated into the computing device 700.

The processing device 702 may be embodied as any type of processor(s) capable of performing the functions described herein. In particular, the processing device 702 may be embodied as one or more single or multi-core processors, microcontrollers, or other processor or processing/controlling circuits. For example, in some embodiments, the processing device 702 may include or be embodied as an arithmetic logic unit (ALU), central processing unit (CPU), digital signal processor (DSP), and/or another suitable processor(s). The processing device 702 may be a programmable type, a dedicated hardwired state machine, or a combination thereof. Processing devices 702 with multiple processing units may utilize distributed, pipelined, and/or parallel processing in various embodiments. Further, the processing device 702 may be dedicated to performance of just the operations described herein, or may be utilized in one or more additional applications. In the illustrative embodiment, the processing device 702 is of a programmable variety that executes algorithms and/or processes data in accordance with operating logic 708 as defined by programming instructions (such as software or firmware) stored in memory 706. Additionally or alternatively, the operating logic 708 for processing device 702 may be at least partially defined by hardwired logic or other hardware. Further, the processing device 702 may include one or more components of any type suitable to process the signals received from input/output device 704 or from other components or devices and to provide desired output signals. Such components may include digital circuitry, analog circuitry, or a combination thereof.

The memory 706 may be of one or more types of non-transitory computer-readable media, such as a solid-state memory, electromagnetic memory, optical memory, or a combination thereof. Furthermore, the memory 706 may be volatile and/or nonvolatile and, in some embodiments, some or all of the memory 706 may be of a portable variety, such as a disk, tape, memory stick, cartridge, and/or other suitable portable memory. In operation, the memory 706 may store various data and software used during operation of the computing device 700 such as operating systems, applications, programs, libraries, and drivers. It should be appreciated that the memory 706 may store data that is manipulated by the operating logic 708 of processing device 702, such as, for example, data representative of signals received from and/or sent to the input/output device 704 in addition to or in lieu of storing programming instructions defining operating logic 708. As illustrated, the memory 706 may be included with the processing device 702 and/or coupled to the processing device 702 depending on the particular embodiment. For example, in some embodiments, the processing device 702, the memory 706, and/or other components of the computing device 700 may form a portion of a system-on-a-chip (SoC) and be incorporated on a single integrated circuit chip.

In some embodiments, various components of the computing device 700 (e.g., the processing device 702 and the memory 706) may be communicatively coupled via an input/output subsystem, which may be embodied as circuitry and/or components to facilitate input/output operations with the processing device 702, the memory 706, and other components of the computing device 700. For example, the input/output subsystem may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations.

The computing device 700 may include other or additional components, such as those commonly found in a typical computing device (e.g., various input/output devices and/or other components), in other embodiments. It should be further appreciated that one or more of the components of the computing device 700 described herein may be distributed across multiple computing devices. In other words, the techniques described herein may be employed by a computing system that includes one or more computing devices. Additionally, although only a single processing device 702, I/O device 704, and memory 706 are illustratively shown in FIG. 7, it should be appreciated that a particular computing device 700 may include multiple processing devices 702, I/O devices 704, and/or memories 706 in other embodiments. Further, in some embodiments, more than one external device 710 may be in communication with the computing device 700.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected.

It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A system, comprising:
    an electronic lock device configured for installation to a door mounted to a wall, the electronic lock device comprising:
        a locking member movable between a locked position and an unlocked position to adjust a locked/unlocked state of the electronic lock device;
        an electronic actuator operable to move the locking member between the locked position and the unlocked position to thereby adjust the locked/unlocked state of the electronic lock device;
        a credential reader mounted to an outer side of the electronic lock device;
        a controller in communication with the electronic actuator and the credential reader, wherein the controller is configured to actuate the electronic actuator to adjust the locked/unlocked state of the electronic device based upon information received from the credential reader; and
        a wireless power receiver in communication with the controller; and
    a light switch configured for installation to the wall and for connection to line power, wherein the light switch includes a wireless power transmitter;
    wherein the wireless power transmitter is configured to transmit a wireless power signal to the wireless power receiver;
    wherein the wireless power receiver is configured to receive the wireless power signal and to harvest electrical power from the wireless power signal; and
    wherein the controller is configured to operate using electrical power harvested by the wireless power receiver.

2. The system of claim 1, wherein the wireless power transmitter is configured to transmit the wireless power signal over an unregulated radio frequency band; and
    wherein the radio frequency receiver is configured to receive over the unregulated radio frequency band.

3. The system of claim 1, wherein the wireless power transmitter is configured to transmit electrical power when the light switch is in an on state and when the light switch is in an off state.

4. The system of claim 1, wherein the electronic lock device further includes an energy storage device in communication with the wireless power receiver and the controller; and
    wherein the energy storage device is configured to receive electrical power from the wireless power receiver and to transmit electrical power to the controller.

5. The system of claim 1, wherein the wireless power transmitter comprises:
    an AC-to-DC converter configured to convert an AC power from the line power to a DC power;
    a wireless power signal generator configured to generate an initial radio frequency signal using the DC power;
    an amplifier configured to amplify the initial radio frequency signal to a selected power, thereby providing a wireless power signal; and
    an antenna configured to transmit the wireless power signal.

6. A system, comprising:
    an electronic lock device configured for installation to a door mounted to a wall, the electronic lock device comprising:
        a locking member movable between a locked position and an unlocked position to adjust a locked/unlocked state of the electronic lock device;
        an electronic actuator operable to move the locking member between the locked position and the unlocked position to thereby adjust the locked/unlocked state of the electronic lock device;
        a credential reader mounted to an outer side of the electronic lock device;
        a controller in communication with the electronic actuator and the credential reader, wherein the controller is configured to actuate the electronic actuator to adjust the locked/unlocked state of the electronic device based upon information received from the credential reader; and
        a wireless power receiver in communication with the controller; and a light switch configured for installation to the wall and for connection to line power, wherein the light switch includes a wireless power transmitter;

wherein the wireless power transmitter is configured to transmit a wireless power signal to the wireless power receiver;

wherein the wireless power receiver is configured to receive the wireless power signal and to harvest electrical power from the wireless power signal;

wherein the controller is configured to operate using electrical power harvested by the wireless power receiver;

wherein the wireless power transmitter includes an antenna and is configured to transmit the wireless power signal via the antenna; and wherein the light switch further comprises an adjustment mechanism operable to adjust an orientation of the antenna.

7. A method, comprising:

transmitting, from a light switch connected to line power and mounted to a wall, a wireless power signal, wherein the light switch includes a light switch housing and a wireless power transmitter integrated with the light switch housing and operable to transmit the wireless power signal, and wherein the light switch is mounted in an electrical box positioned within the wall;

receiving, by an electronic access control device, the wireless power signal; and operating the electronic access control device using electrical power harvested from the wireless power signal.

8. The method of claim 7, wherein the light switch further comprises a movable member movably mounted to the light switch housing and operable to transition the light switch between a first state and a second state.

9. The method of claim 8, wherein the light switch is located within three feet of the electronic access control device when the door is in a closed position.

10. The method of claim 7, wherein the electronic access control device comprises an electronic lockset comprising:

a locking member movable between a locked position and an unlocked position to adjust a locked/unlocked state of the electronic lock device;

an electronic actuator operable to move the locking member between the locked position and the unlocked position to thereby adjust the locked/unlocked state of the electronic lock device;

a credential reader mounted to an outer side of the electronic lockset;

a controller in communication with the electronic actuator and the credential reader, wherein the controller is configured to actuate the electronic actuator to adjust the locked/unlocked state of the electronic device based upon information received from the credential reader; and a wireless power receiver in communication with the controller; and wherein the receiving the wireless power signal is performed by the wireless power receiver.

11. The method of claim 10, wherein the electronic lockset further comprises an energy storage device in communication with the wireless power receiver and the controller; and wherein the method further comprises storing the harvested energy at the energy storage device, and transmitting the harvested energy from the energy storage device to the controller.

12. The method of claim 10, wherein operating the electronic access control device comprises:

generating, by the credential reader, credential information;

comparing, by the controller, the credential information to authorized credential information;

in response to the credential information matching the authorized credential information, transmitting, from the controller to the electronic actuator, an unlock command; and moving, by the electronic actuator and in response to receiving the unlock command, the locking member from the unlocked position to the locked position.

13. The method of claim 7, wherein the light switch comprises a toggle operable to transition the light switch between a first state and a second state; and wherein transmitting comprises transmitting the wireless power signal when the light switch is in the first state and transmitting the wireless power signal when the light switch is in the second state.

14. The method of claim 7, further comprising:

converting, by an AC-to-DC converter connected to the line power, an AC power from the line power to a DC power;

generating, by a radio frequency generator connected to the AC-to-DC converter, an initial wireless signal using the DC power; and amplifying, by an amplifier connected to the wireless power signal generator, the initial wireless signal to a selected power, thereby providing an amplified wireless power signal; and wherein the transmitting comprises transmitting, by an antenna connected to the amplifier, the amplified wireless power signal.

15. The method of claim 7, wherein the wall-mounted electrical device further comprises an antenna by which the wireless power signal is transmitted and an adjustment mechanism operable to adjust an orientation of the antenna relative to the wall; and wherein the method further comprises operating the adjustment mechanism to adjust the orientation of the antenna, thereby adjusting a received strength of the wireless power signal at the electronic access control device.

16. The system of claim 1, further comprising a light switch housing, wherein the light switch and the wireless power transmitter are integrated into the light switch housing, and the light switch housing is configured for mounting within a standard electrical box positioned within the wall.

17. A light switch configured for connection to AC line power, the light switch comprising:

a light switch housing;

a movable member movably mounted to the light switch housing and operable to transition the light switch between a first state and a second state; and a wireless power transmitter integrated with the light switch housing, the wireless power transmitter comprising:

an AC-to-DC power converter configured for connection to the AC line power and configured to convert the AC line power to a DC power;

a radio frequency generator connected to the AC-to-DC converter and configured to generate a radio frequency signal using the DC power;

an amplifier connected to the radio frequency generator and configured to amplify the radio frequency signal to a predetermined power, thereby providing a wireless power signal; and an antenna connected to the amplifier and configured to transmit the wireless power signal at a predetermined frequency.

18. The light switch of claim 17, wherein the wireless power transmitter is configured to transmit the wireless power signal when the light switch is in the first state and when the light switch is in the second state.

19. The light switch of claim 17, further comprising an adjustment mechanism operable to adjust an orientation of the antenna relative to the housing.

20. The light switch of claim 19, wherein the adjustment mechanism is operable to adjust the orientation of the antenna about each of a first axis and a second axis perpendicular to the first axis.

21. The light switch of claim 19, wherein the antenna is a directional antenna.

22. The light switch of claim 17, wherein the light switch, when connected to a power line providing the AC line power, forms a portion of an electrical circuit that includes an electrical device external to the light switch;

wherein the light switch is configured to open the electrical circuit when in the first state to thereby deactivate the electrical device; and wherein the light switch is configured to close the electrical circuit when in the second state to thereby activate the electrical device.

23. The light switch of claim 17, wherein the light switch housing is configured for mounting within a standard electrical box positioned within a wall.

* * * * *